US012580520B2

(12) United States Patent
Chang

(10) Patent No.: US 12,580,520 B2
(45) Date of Patent: Mar. 17, 2026

(54) SOLAR CELL MODULE AND SOLAR ENERGY POWER SYSTEM WITH ICE-DISSOLVING FUNCTION

(71) Applicant: Yaue-Sheng Chang, Taoyuan (TW)

(72) Inventor: Yaue-Sheng Chang, Taoyuan (TW)

( * ) Notice: Subject to any disclaimer, the term of this patent is extended or adjusted under 35 U.S.C. 154(b) by 116 days.

(21) Appl. No.: 18/388,482

(22) Filed: Nov. 9, 2023

(65) Prior Publication Data

US 2025/0158565 A1 May 15, 2025

(51) Int. Cl.
H02S 40/12 (2014.01)
H02S 40/38 (2014.01)
H10F 77/30 (2025.01)
H10F 77/42 (2025.01)

(52) U.S. Cl.
CPC .............. H02S 40/12 (2014.12); H02S 40/38 (2014.12); H10F 77/311 (2025.01); H10F 77/484 (2025.01)

(58) Field of Classification Search
CPC ........ H10F 77/311; H02S 40/12; H02S 40/44; H02S 40/38
See application file for complete search history.

(56) References Cited

U.S. PATENT DOCUMENTS

2010/0193029 A1* 8/2010 Murphy ............ B32B 17/10302
264/277
2011/0056924 A1* 3/2011 Townsend ................ H05B 3/84
219/541

2012/0258294 A1* 10/2012 Leyder ............... H10K 59/8731
204/192.1
2014/0041713 A1* 2/2014 Adler ....................... H05B 3/26
136/251

FOREIGN PATENT DOCUMENTS

| CN | 103825299 | A | * | 5/2014 | |
| CN | 104821773 | A | * | 8/2015 | .............. H02J 3/385 |
| CN | 104852098 | A | * | 8/2015 | |
| JP | 2004039753 | A | * | 2/2004 | |
| WO | WO-2017107783 | A1 | * | 6/2017 | ......... H01L 31/0232 |

OTHER PUBLICATIONS

English machine translation of Li et al. (WO 2017/107783) published Jun. 29, 2017.*

(Continued)

*Primary Examiner* — Christina Chern
(74) *Attorney, Agent, or Firm* — Che-Yang Chen; Law Office of Michael Chen

(57) ABSTRACT

A solar cell module and a solar energy power system with ice-dissolving function are disclosed. The solar cell module includes a substrate, a flexible lithium ceramic battery, a first bonding layer, a conductive heating film layer, a second bonding layer, several solar cells, a waterproof film layer, a third bonding layer, a highly transparent light-concentrating ETFE layer and a ring bonding wall. The invention stores part of the power generated by the solar cells in the flexible lithium ceramic battery. When the solar cell module encounters temperatures below freezing point, the power in the flexible lithium ceramic battery can be controlled to be released to the conductive heating film layer to generate heat and dissolve the ices on the surface of the solar cell module.

2 Claims, 6 Drawing Sheets

(56)     References Cited

OTHER PUBLICATIONS

English machine translation of Kawakami (JP 2004-039753) published Feb. 5, 2004.*

English machine translation of Gao (CN 104852098) published Aug. 19, 2015.*

English machine translation of Zheng (CN 104821773) published Aug. 5, 2015.*

English machine translation of Xiao (CN 103825299) published May 28, 2014.*

\* cited by examiner to an external load where the DC power with a working voltage is outputted to

SOLAR CELL MODULE AND SOLAR ENERGY POWER SYSTEM WITH ICE-DISSOLVING FUNCTION

FIELD OF THE INVENTION

The present invention relates to a solar cell module and a solar energy power system. More particularly, the present invention relates to a solar cell module and a solar energy power system with ice-dissolving function.

BACKGROUND OF THE INVENTION

A solar cell is a device that converts solar energy into electrical energy, also known as photovoltaic cell. Its operating principle is based on the photoelectric effect. When sunlight hits the surface of a solar cell, photons will hit the semiconductor material to excite electrons and generate electric current. This electrical energy can be captured and stored for daily power use or storage purposes. At present, solar cell technology has become very mature and widely used. It is widely used in residential, commercial and industrial areas to supply power needs. Many countries and regions encourage solar power generation, which helps reduce dependence on traditional fossil fuels, while reducing greenhouse gas emissions and helping to combat climate change. Solar cells are becoming more attractive as their costs continue to fall and their efficiency increases. In addition, continuous technological innovations, such as single crystal solar cells, thin film solar cells, and organic solar cells, help expand the scope of applications. Solar cells are also used in many remote areas or areas where the power grid is unstable to provide reliable power supply. As a clean and renewable energy source, solar cells are constantly changing the energy industry and making important contributions to sustainable development.

When solar cells are used in tropical or subtropical areas, they encounter few problems. However, there will be some problems that affect operation when used in cold areas. This is mainly due to the adverse effects of low temperature and climatic conditions on solar cell performance. First, low temperature will reduce the performance of solar cells. Because the voltage of the solar cell drops, the current decreases, resulting in a decrease in output power. In addition, snow and frost common in cold areas may cover the surface of solar cells, further reducing light absorption and reducing power generation. Furthermore, extreme low temperatures may damage the material properties of solar cells and shorten the life of the battery. To overcome these problems, solar power generation systems in cold areas may require more insulation measures, such as heating systems, to ensure that the solar cell operates normally under extreme cold conditions. Regular cleaning of the solar cell module surface to remove snow and frost will also help improve performance. However, whether it is the use of additional insulation devices or snow and defrost equipment, it is a considerable expense for the overall solar power generation system. In addition, it is not cost-effective to use most of the electric energy obtained by the solar cell to maintain the surrounding temperature.

In order to solve the problems encountered when solar cells are used in cold areas, the present invention is proposed.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In order to solve the aforementioned problems, the present invention proposes a solar cell module with ice-dissolving function. It comprises: a substrate, comprising a first area and a second area surrounding the first area, wherein a plurality of through holes are formed in the first area adjacent to the second area; a flexible lithium ceramic battery (FLCB) fixed below the first area, having a positive contact and a negative contact; a first bonding layer, laid and bonded over the first area; a conductive heating film layer, located above the first bonding layer, bonded to the substrate through the first bonding layer; a second bonding layer, laid and bonded over the conductive heating film layer; a plurality of solar cells, fixed in the second bonding layer, wherein the plurality of solar cells are electrically connected in parallel and/or series, and electrical energy converted from solar energy is output through a positive wire and a negative wire, wherein the positive wire extends out of the second bonding layer and passes through one of the through holes to electrically connect with the positive contact and a positive end of a load, and the negative wire extends out of the second bonding layer and passes through another of the through holes to electrically connect with the negative contact and a negative end of the load; a waterproof film layer, bonded on top of the second bonding layer, preventing moisture from intruding into the structure therebelow; a third bonding layer, laid and bonded over the waterproof film layer; a highly transparent light-concentrating Ethylene Tetrafluoroethylene (ETFE) layer, with an upper surface thereof having a plurality of brightness enhancement structures having a three-dimensional corrugated shape, bonded on top of the third bonding layer, wherein multi-directional light beams from the outside are guided to inside of the brightness enhancement structures by the brightness enhancement structures and incident downward to the solar cells; and a ring bonding wall, surroundingly bonded to the sides of the first bonding layer, the conductive film heating film, the second bonding layer, the waterproof film layer and the third bonding layer. The positive contact and the negative contact are respectively connected to the conductive heating film layer through one of the through holes with a wire, and a circuit switch is installed on one of the wires to conduct or break a circuit between the flexible lithium ceramic battery and the conductive heating film layer.

The present invention also proposes another solar cell module with ice-dissolving function. It comprises: a substrate, comprising a first area and a second area surrounding the first area; a first bonding layer, laid and bonded over the first area; a flexible lithium ceramic battery, fixed in the first bonding layer, having a positive contact and a negative contact; a conductive heating film layer, located above the first bonding layer, bonded to the substrate through the first bonding layer; a second bonding layer, laid and bonded over the conductive heating film layer; a plurality of solar cells, fixed in the second bonding layer, wherein the plurality of solar cells are electrically connected in parallel and/or series, and electrical energy converted from solar energy is output through a positive wire and a negative wire, wherein the positive wire extends out of the second bonding layer to electrically connect with the positive contact and a positive end of a load, and the negative wire extends out of the second bonding layer to electrically connect with the negative contact and a negative end of the load; a waterproof film layer, bonded on top of the second bonding layer, preventing moisture from intruding into the structure therebelow; a third bonding layer, laid and bonded over the waterproof film layer; a highly transparent light-concentrating ETFE layer, with an upper surface thereof having a plurality of brightness enhancement structures having a three-dimensional corrugated shape, bonded on top of the third bonding layer, wherein multi-directional light beams from the outside are guided to inside of the brightness enhancement structures by the brightness enhancement structures and incident downward to the solar cells; and a ring bonding wall, surroundingly bonded to the sides of the first bonding layer, the conductive film heating film, the second bonding layer, the waterproof film layer and the third bonding layer. The positive contact and the negative contact are respectively connected to the conductive heating film layer with a wire, and a circuit switch is installed on one of the wires to conduct or break a circuit between the flexible lithium ceramic battery and the conductive heating film layer.

In the solar cell module with ice-dissolving function, a temperature detector is further installed on the second area to detect the temperature at the substrate and transmit detection results to the outside through a signal line.

Preferably, a material of the substrate may be stainless steel, aluminum, aluminum alloy or plastic.

Preferably, a material of the first bonding layer may be Ethylene-Vinyl Acetate (EVA), Polyolefin Elastomers (POE) or Expandable Polyethylene (EPE).

Preferably, a material of the second bonding layer may be EVA, POE or EPE.

Preferably, a material of the third bonding layer may be EVA, POE or EPE.

Preferably, a material of the ring bonding wall may be EVA, POE or EPE.

Preferably, a material of the conductive heating film layer may be graphene conductive heating paper, graphene conductive heating non-woven fabric or conductive heating cloth.

Preferably, a material of the waterproof film layer may be Polyethylene Terephthalate (PET), ETFE or Polycarbonates (PC).

Preferably, the three-dimensional corrugated shape of the brightness enhancement structure is a circle that is consecutively adjacent to one another in a plane viewed from the top.

A solar energy power system with ice-dissolving function is also proposed in the present invention. It comprises: a plurality of the aforementioned solar cell modules; a pair of DC bus wires, wherein a positive DC bus wire is electrically connected to extended ends of the positive wires in the solar cell modules, a negative DC bus wire is electrically connected to extended ends of the negative wires in the solar cell modules; an inverter converting incoming DC power into AC power that complies with power grid connection specifications and integrating the converted AC power into a power grid; a power output controller, electrically coupled to the pair of DC bus wires and electrically connected to the inverter, integrating the DC power generated by all solar cell modules, breaking the electrical coupling with the pair of DC bus wires after a current exceeds a set value, converting part of the integrated DC power into DC power with a working voltage and then outputting the converted DC power, and passing the remaining integrated DC power into the inverter; and a circuit switch control circuit, electrically connected to the power output controller and signally connecting to the circuit switches and temperature detectors of the solar cell modules, continuously receiving a temperature measurement value from any temperature detector and performing following operations: determining whether the temperature measurement value is lower than 0 degrees Celsius, if the judgment of operation a) being true, turning on the circuit switch of the solar cell module where the temperature detector is located to conduct the circuit between the flexible lithium ceramic battery and the conductive heating film layer to heat the solar cell module; and c) if the temperature measurement value transmitted by the temperature detector of the solar cell module after heating being higher than a set temperature, then turning off the circuit switch of the solar cell module to interrupt the circuit between the flexible lithium ceramic battery and the conductive heating film layer. According to the present invention, the set temperature may be between 5 degrees Celsius and 25 degrees Celsius.

The present invention stores part of the power generated by the solar cell in the flexible lithium ceramic battery. When the solar cell module encounters temperatures below freezing, the power in the flexible lithium ceramic battery can be controlled to be released to the conductive heating film layer to generate heat and dissolve the ices on the surface of the solar cell module. Using the flexible lithium ceramic battery to replace additional snow removal and ice melting device is lower cost. In addition, only part of the electric energy obtained by the solar cell is used to maintain the temperature of the solar cell module at a level where water vapor cannot condense. Power will not consume too much and affect the overall power generation efficiency.

DETAILED DESCRIPTION OF THE PREFERRED EMBODIMENTS

The present invention will now be described more specifically with reference to the following embodiments.

Figure 1:
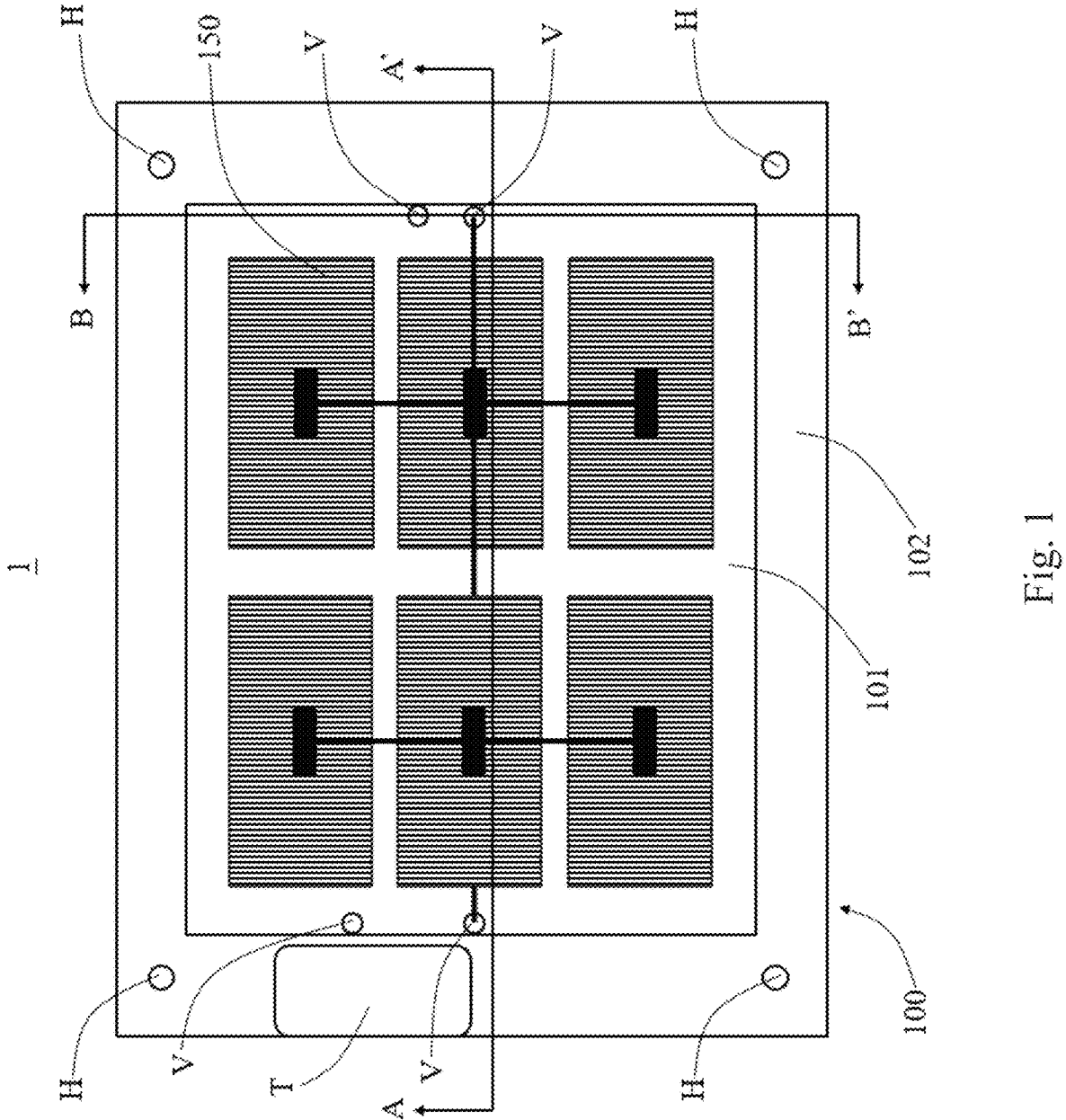
FIG. 1 is a top view diagram of a solar cell module with ice-dissolving function according to an embodiment of the present invention.
Figure 2:
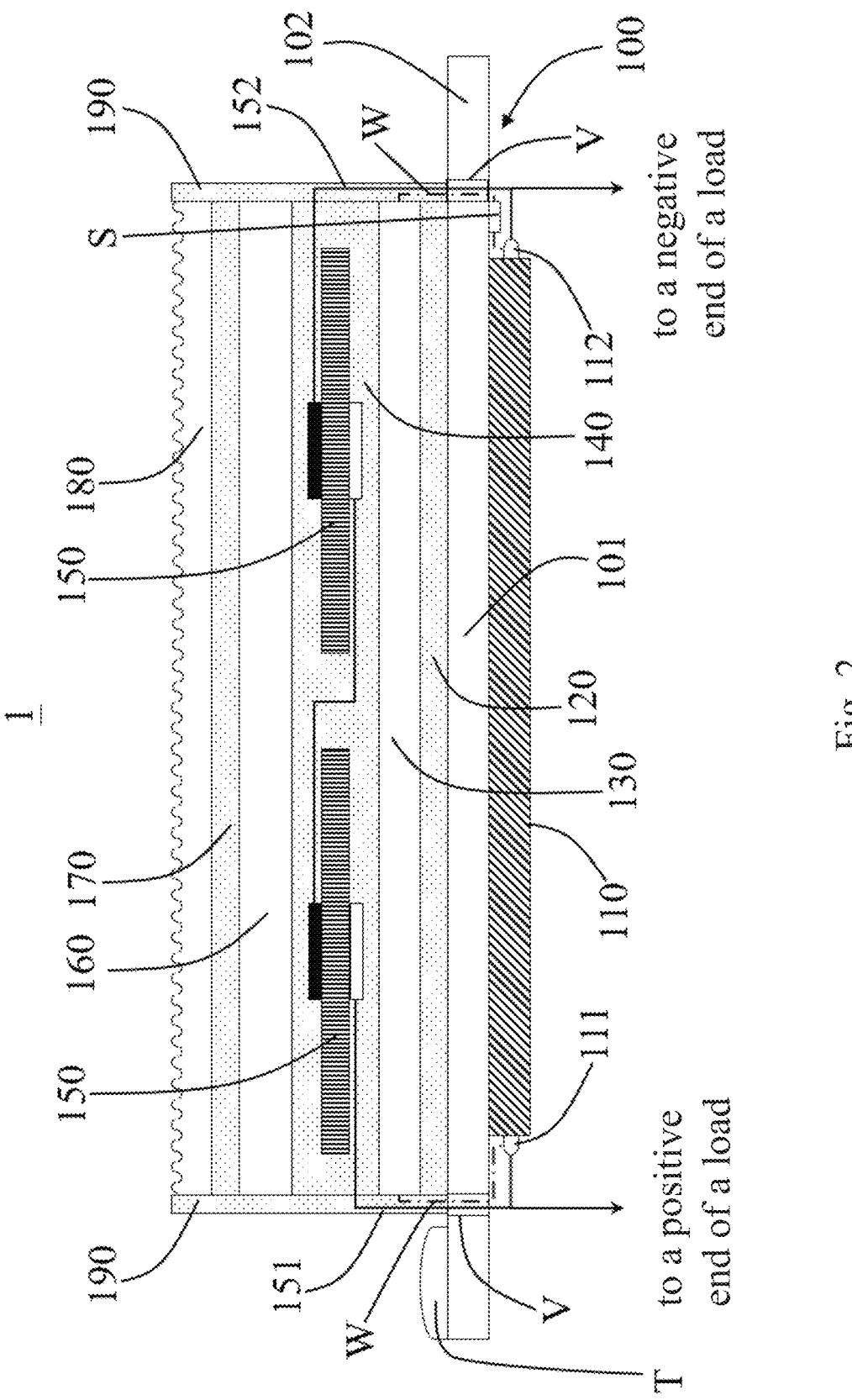
FIG. 2 is a cross-sectional view of the solar cell module along line AA' in FIG. 1.
Figure 3:
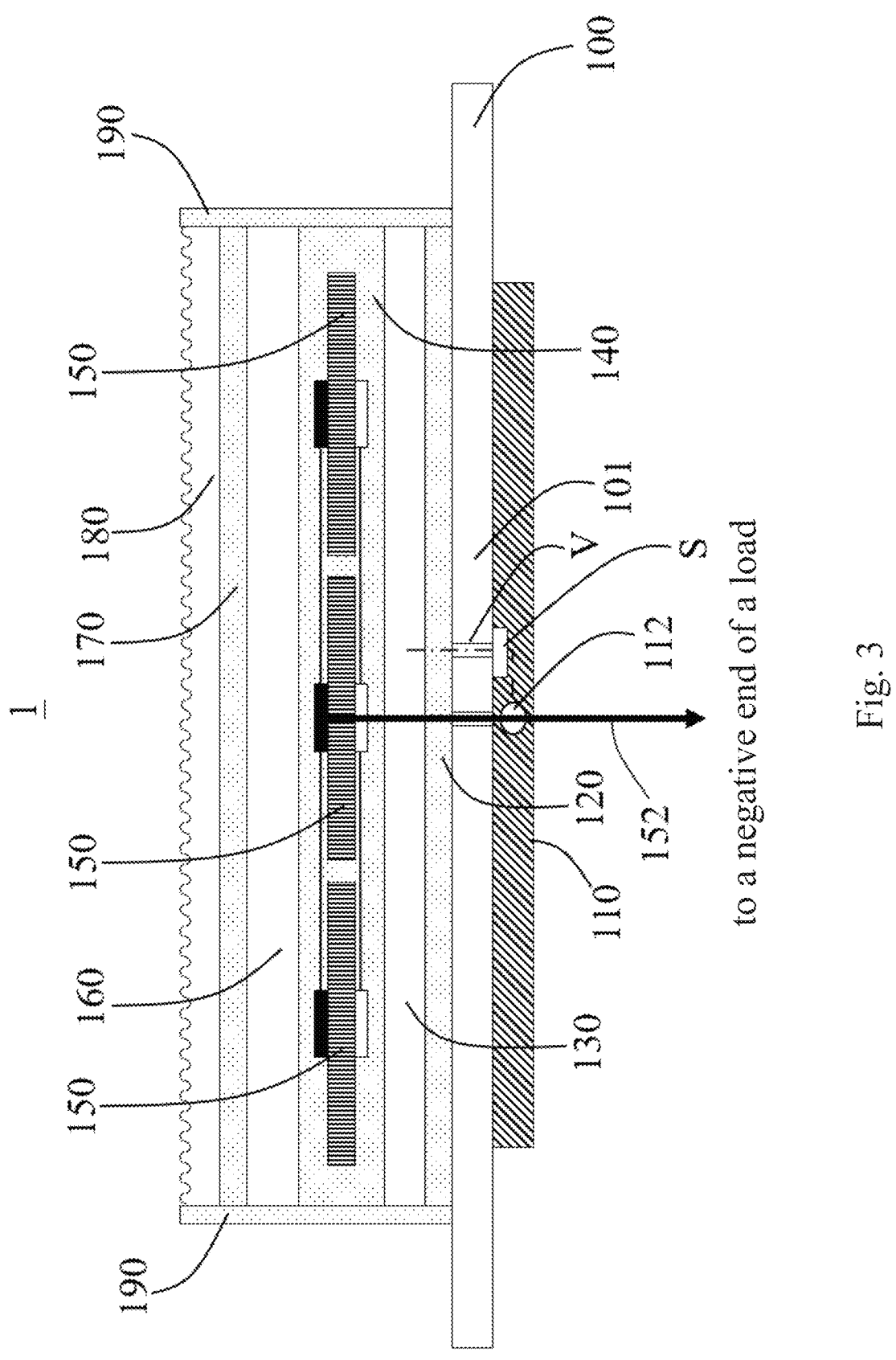
FIG. 3 is a cross-sectional view of the solar cell module along line BB' in FIG. 1.

See FIG. 1, it is a top view diagram of a solar cell module 1 with ice-dissolving function according to an embodiment of the present invention. For the convenience of explanation, the figures also provide multiple cross-sectional views of the solar cell module 1. For example, FIG. 2 is a cross-sectional view of the solar cell module 1 along line AA' in FIG. 1, and FIG. 3 is a cross-sectional view of the solar cell module 1 along the line BB' in FIG. 1. It should be noted that, for convenience of illustration, these figures are not drawn to scale according to actual product designs. For example, the ratio of the actual length and thickness of solar cell module 1 may be tens to hundreds to one. Such a design will cause the thickness of the diagram to be excessively squeezed and the content cannot be clearly discerned. Therefore, the thickness of FIG. 2 and FIG. 3 is much larger than its length and width. The positions between components and the thickness, length and width of components are also illustrative, and the invention is not limited to the contents of the drawings.

Structurally speaking, the solar cell module 1 in the present embodiment includes a substrate 100, a flexible lithium ceramic battery (FLCB) 110, a first bonding layer 120, a conductive heating film layer 130, a second bonding layer 140, a number of solar cells 150, a waterproof film layer 160, a third bonding layer 170, a highly transparent light-concentrating Ethylene Tetrafluoroethylene (ETFE) layer 180 and a ring bonding wall 190. Characteristics, functions, materials and combination methods of each of the above technical components will be detailed in the text below.

The substrate 100 is the basis for carrying other components and needs to have sufficient toughness. Preferably, it resists heat, cold and moisture. Therefore, the substrate 100 can be made of stainless steel, aluminum, aluminum alloy or plastic. In the present embodiment, stainless steel is used as an example to illustrate. In principle, the appearance of the substrate 100 is not limited. The shape of the substrate 100 in the present embodiment is rectangular as an example. The substrate 100 comprises a first area 101 and a second area 102 surrounding the first area 101. The first area 101 is an area used to stack other technical components for power generation, and the second area 102 is an area used to install a temperature detector T that monitors the solar cell module 1 and form fixing screw holes H. In the present embodiment, the first area 101 is a small rectangular area in the center of the substrate 100, and the second area 102 is located on the periphery of the first area 101, forming another larger hollow rectangular area on the periphery. It should be noted that several through holes V are formed in the first area 101 adjacent to the second area 102. The purpose of setting the through holes V is to allow the components formed above the first area 101 to be electrically connected to the components below them through the through holes V.

The flexible lithium ceramic battery 110 is a secondary battery that is very thin relative to its length, soft and bendable but has high power storage efficiency. The present invention uses the flexible lithium ceramic battery 110 as an energy source to heat the solar cell module 1 when encountering low temperatures. The flexible lithium ceramic battery 110 is fixed below the first area 101 and has a positive contact 111 and a negative contact 112. The flexible lithium ceramic battery 110 can be fixed with glue or screws. If necessary, the flexible lithium ceramic battery 110 can be laid with a bonding protective layer using a material of Ethylene-Vinyl Acetate (EVA), Polyolefin Elastomers (POE) or Expandable Polyethylene (EPE).

The first bonding layer 120 is laid and bonded over the first area 101. Its material is EVA. The first bonding layer 120 can be implemented by using a piece of EVA film of appropriate size, which is heated and pressed under certain conditions to cause melting, bonding and adhesive curing, to bond the substrate 100 and the conductive film heating layer 130 above. EVA is non-sticky and anti-sticky at room temperature. After curing, the EVA film becomes completely transparent and has a very high light transmittance. The cured EVA film is elastic, has the advantages of heat resistance, moisture resistance, low temperature resistance and impact resistance, and has good adhesion to metallic glass and plastics. It can maintain the overall stability of the solar cell module 1 (not easy to crack). Considering environmental factors, the material of the first bonding layer 120 can also be POE or EPE, which has similar characteristics to EVA.

The conductive heating film layer 130 is located above the first bonding layer 120, bonded to the substrate 100 through the first bonding layer 120. The conductive heating film layer 130 will generate heat after DC current is passed through it and a circuit is formed, which is the main technical component for heating the solar cell module 1 when encountering low temperatures. According to the present invention, a material of the conductive heating film layer 130 may be graphene conductive heating paper, graphene conductive heating non-woven fabric or conductive heating cloth.

The second bonding layer 140 is laid and bonded over conductive heating film layer 130. In the second bonding layer 140, several solar cells 150 are fixed. Like the first bonding layer 120, the second bonding layer 140 can use EVA, POE or EPE as material. The approach is slightly different. In the present embodiment, a piece of EVA film may be placed above the conductive heating film layer 130. After hot pressing, the solar cells 150 is placed on the EVA film in the molten state, and then another piece of EVA film is placed on the solar cells 150. It is then heated to complete melting, bonding and adhesive curing.

See FIG. 1. For convenience of explanation, the present embodiment uses 6 solar cells 150 for illustration. These solar cells 150 are fixed in the second bonding layer 140. The solar cell 150 are electrically connected in parallel and/or series. The solar cells 150 in the present embodiment are connected in parallel in groups of three, and the two groups are connected in series. These solar cells 150 output electrical energy converted from solar energy through a positive wire 151 and a negative wire 152. The positive wire 151 and the negative wire 152 may be copper foil wire. It is shown with thick solid lines in FIG. 2 and FIG. 3. The positive wire 151 extends out of the second bonding layer 140 and passes through one of the through holes V to electrically connect with the positive contact 111 and a positive end of a load (e.g., a light bulb, or a DC bus wire of a solar energy power system. The negative wire 152 extends out of the second bonding layer 140 and passes through another of the through holes V to electrically connect with the negative contact 112 and a negative end of the load. It can be seen that these solar cells 150 and flexible lithium ceramic battery 110 form an electrical circuit. At the same time, it also forms an electrical circuit with the aforementioned load. The flexible lithium ceramic battery 110 is connected in parallel with the load. Therefore, in addition to providing the load, the DC power generated by the solar cell 150 also charges the flexible lithium ceramic battery 110 until the flexible lithium ceramic battery 110 cannot receive more power.

The waterproof film layer 160 is bonded on top of the second bonding layer 140, preventing moisture from intruding into the structure below itself. According to the present invention, a material of the waterproof film layer 160 may be, but not limited to Polyethylene Terephthalate (PET), ETFE or Polycarbonates (PC).

The third bonding layer 170 is laid and bonded over the waterproof film layer 160. The material and construction method used for the third bonding layer 170 are the same as that of the first bonding layer 120 and will not be described again here.

Figure 4:
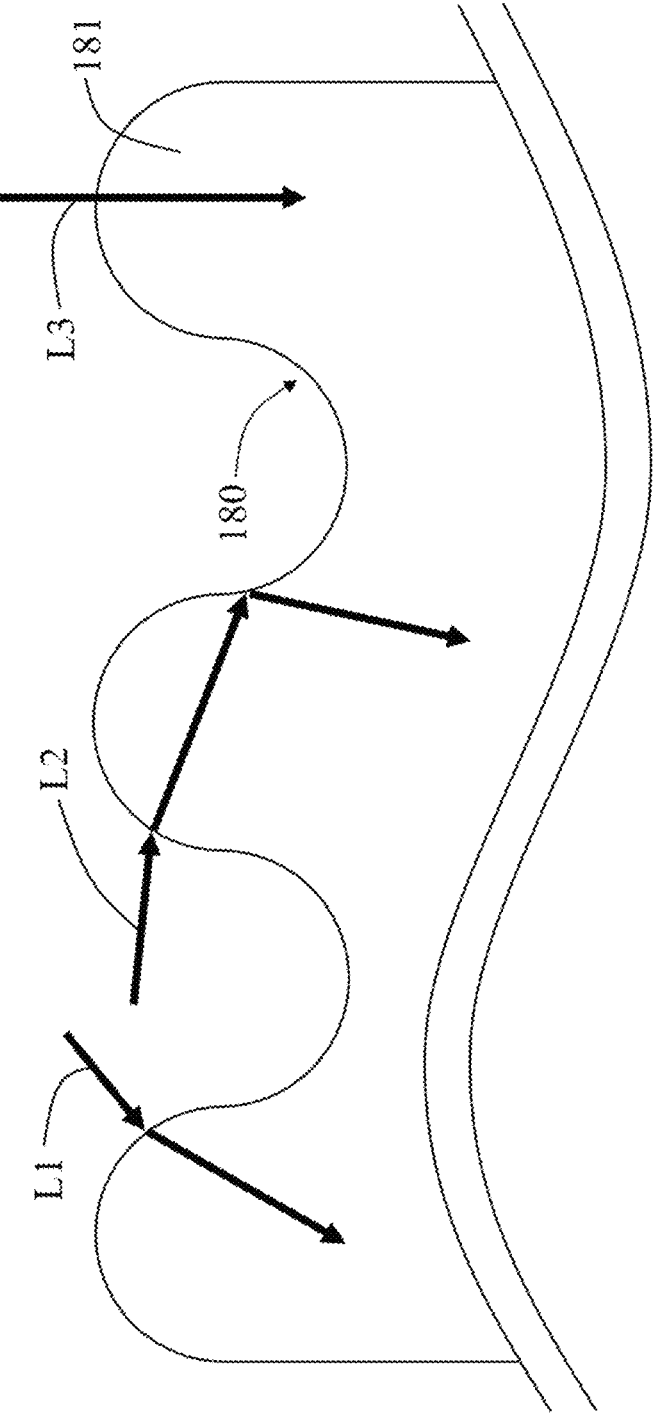
FIG. 4 illustrates the approach and effect of brightness enhancement structure on changing light path.

The highly transparent light-concentrating ETFE layer 180 has an upper surface. The upper surface has a number of brightness enhancement structures which have a three-dimensional corrugated shape. The highly transparent light-concentrating ETFE layer 180 is bonded on top of the third bonding layer. multi-directional light beams from the outside are guided to inside of the brightness enhancement structures by the brightness enhancement structures and incident downward to the solar cells 150. In order to have a better understanding of brightness enhancement structure, see FIG. 4. It illustrates the approach and effect of brightness enhancement structure on changing light path. In FIG. 4, the highly transparent light-concentrating ETFE layer 180 is the technical component for the solar cell modules 1 to receive external light beams. The upper surface of the highly transparent light-concentrating ETFE layer 180 has a number of brightness enhancement structures 181 each having three-dimensional corrugated shape. Continuous "peak-trough" cross-sectional edge shapes in any cross section of the brightness enhancement structure 181 can be obtained. The three-dimensional corrugated shape of the brightness enhancement structure 181 is a circle that is consecutively adjacent to one another in a plane viewed from the top, and each circle has a radius of curvature no more than 1 mm. The light path of the incident light is represented by a single arrow or continuous arrows. Due to the three-dimensional corrugated shape of the brightness enhancement structure 181, external light beams from multi-directions can be guided into the brightness enhancement structure 181. For example, on a light path L1, the light beams are refracted and directed to the highly transparent light-concentrating ETFE layer 180; on a light path L2, light beams enter the highly transparent light-concentrating ETFE layer 180 after one refraction and one total reflection; on a light path L3, since the incident angle of the light beams is perpendicular to the incident surface, the light beams do not change the direction and directly enter the highly transparent light-concentrating ETFE layer 180. Based on the above three light paths, more light beams outside of the highly transparent light-concentrating ETFE layer 180 can enter the highly transparent light-concentrating ETFE layer 180. Thus, the light beams that the solar cells 150 can obtain increase, and the photoelectric conversion efficiency of the solar cells 150 is also increased.

The ring bonding wall 190 is surroundingly bonded to the sides of the first bonding layer 120, the conductive heating film layer 130, the second bonding layer 140, the waterproof film layer 160 and the third bonding layer 170. In fact, the ring bonding wall 190 is a protective layer formed after the materials of the first bonding layer 120, the second bonding layer 140 and the third bonding layer 170 is hot-melted to overflow to the sides and condensed. The material is therefore EVA, POE or EPE.

The greatest function of the present invention is that when the solar cell module 1 is at a low temperature (below 0 degrees Celsius), it can generate controlled heat to dissolve ices condensed on the surface, thereby increasing the power generation efficiency of the solar cell module 1. Heating is performed by the conductive heating film layer 130. In order to achieve the purpose of controllable heating, the flexible lithium ceramic battery 110 has the following special design. As shown in FIG. 2, the positive contact 111 and the negative contact 112 of the flexible lithium ceramic battery 110 are respectively connected to the conductive heating film layer 130 through one of the through holes V with a wire W. For ease of explanation, the wire W is shown as a dotted line. It should be noted that wire W and positive wire 151 or negative wire 152 in FIG. 2 seem to be passed through the same through hole V, but they actually pass through two through holes V, respectively. These two through holes V overlap in the vertical direction of the page. A circuit switch S is installed on one of the wires W to conduct or break a circuit between the flexible lithium ceramic battery 110 and the conductive heating film layer 130. When the circuit is conducted, the conductive heating film layer 130 generates heat to heat the entire solar cell module 1; on the contrary, the solar cell module 1 gradually drops to the temperature of the surrounding environment. The circuit switch S may be a mechanical switch, manually operated by humans; the circuit switch S may also be an electronic switch, remotely controlled by other control devices.

As shown in FIG. 1 and FIG. 2, a temperature detector T is installed on the second area 102. The purpose of the temperature detector T is to detect the temperature at substrate 100 and transmit detection results to the outside through a signal line. The specific function of the temperature detector T will be explained together with the solar energy power system of the present invention.

According to the present invention, the flexible lithium ceramic battery 110 can be installed in other ways, which will be described in another embodiment.

Figure 5:
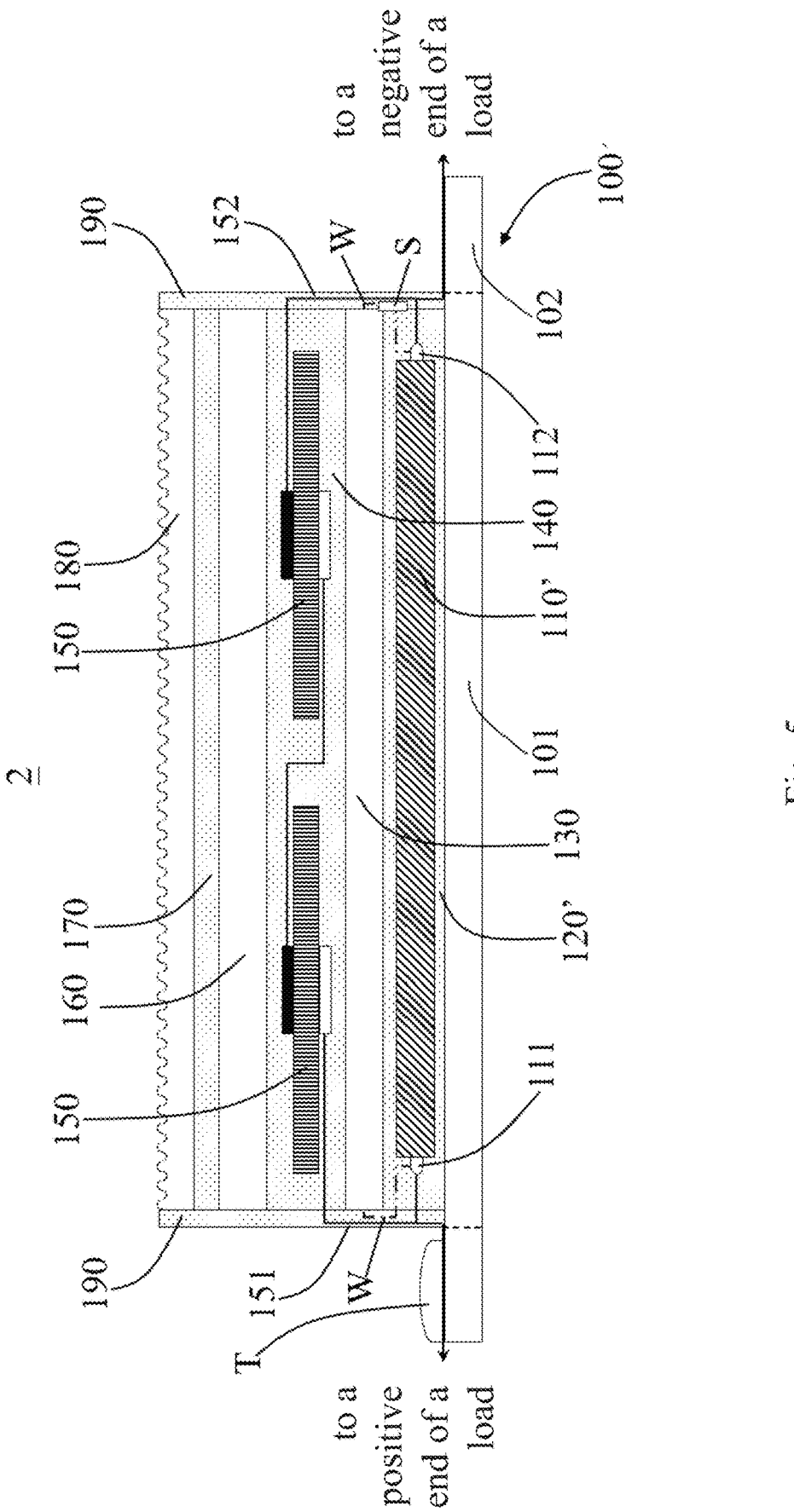
FIG. 5 is a sectional view of a solar cell module with ice-dissolving function according to another embodiment of the present invention.

See FIG. 5. It is a sectional view of a solar cell module 2 with ice-dissolving function according to another embodiment of the present invention. The solar cell module 2 comprises a substrate 100', a flexible lithium ceramic battery 110', a first bonding layer 120', a conductive heating film layer 130, a second bonding layer 140, a number of solar cells 150, a waterproof film layer 160, a third bonding layer 170, a highly transparent light-concentrating ETFE layer 180 and a ring bonding wall 190 In order to simplify the description, the same component symbols as in the previous embodiment are used in the present embodiment to represent the same technical components, and their functions, shapes, materials and manufacturing methods are the same, and will not be described again. These different technical components will be described in detail below.

The substrate 100' also includes a first area 101 and a second area 102 surrounding the first area 101. However, in the present embodiment, there is no need to provide through holes V on the substrate 100'. Since there are no through holes V separating the first area 101 and the second area 102, the boundary between the two is shown with a dotted line. Thus, the positive wire 151 can directly electrically connect with the positive contact 111 of the flexible lithium ceramic battery 110' and a positive end of a load after extending out of the second bonding layer 140. The negative wire 152 can also directly electrically connect with the negative contact 112 and a negative end of the load after extending out of the second bonding layer 140. They don't pass through the through holes V anymore. In addition, a temperature detector T can also be installed on the second area 102.

The first bonding layer 120' is also laid and bonded over the first area 101. However, the difference from the previous embodiment is that the flexible lithium ceramic battery 110' is not fixed below the first area 101 but is fixed in the first bonding layer 120'. The fixing method is the same as solar cell 150 being fixed in the second bonding layer 140, which will not be described again. Therefore, the positive contact 111 and the negative contact 112 that the flexible lithium ceramic battery 110' has is also embedded in the first bonding layer 120'. Since there is no through hole V, correspondingly, the positive contact 111 and the negative contact 112 are respectively connected to the conductive heating film layer 130 with a wire W (drawn by dotted lines). A circuit switch S is also installed on one wire W to conduct or break a circuit between the flexible lithium ceramic battery 110' and the conductive heating film layer 130.

Figure 6:
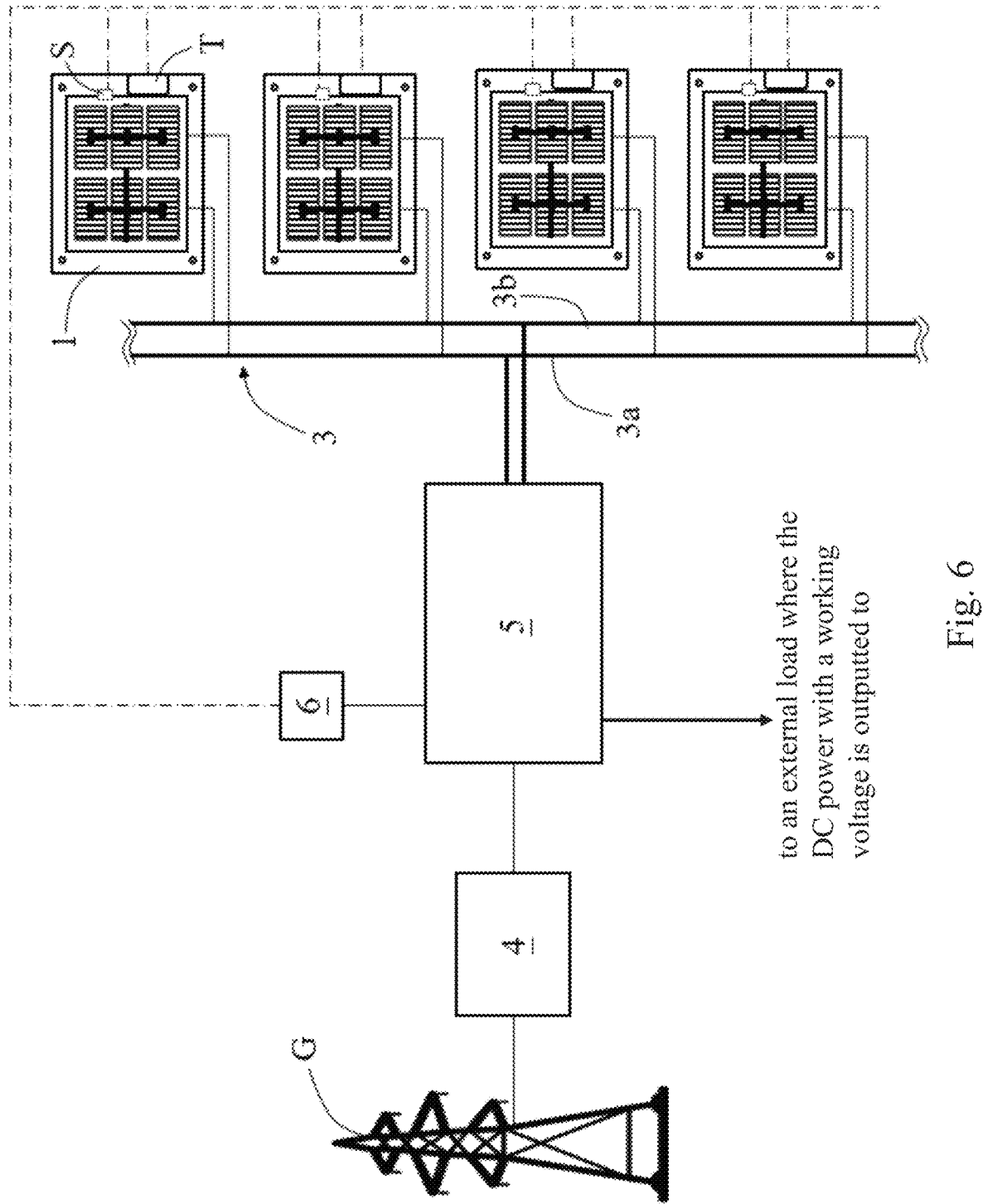
FIG. 6 is a schematic diagram of the components of a solar energy power system with ice-dissolving function using multiple solar cell modules with ice-dissolving function.

In the present invention, a solar energy power system with ice-dissolving function is proposed based on the aforementioned solar cell modules. See FIG. 6. It is a schematic diagram of the components of the solar energy power system. The solar energy power system includes a number of solar cell modules in any one of the embodiments, a pair of DC bus wires 3, an inverter 4, a power output controller 5 and a circuit switch control circuit 6. The present embodiment takes solar cell module 1 as an example. There are four units. However, in practice, the number of solar cell modules is not limited.

The pair of DC bus wired 3 includes a positive DC bus wire 3*a* and a negative DC bus wire 3*b*. The positive DC bus wire 3*a* is electrically connected to extended ends of the positive wires in the solar cell modules 1. The negative DC bus wire 3*b* is electrically connected to extended ends of the negative wires in the solar cell modules 1. In this way, the circuit between the pair of DC bus wires 3 and the power grid G becomes the load of each solar cell module 1, but this load is to transfer the power generated by the solar cell module 1 somewhere else, rather than consume it.

The inverter 4 is not an ordinary DC to AC inverter. The inverter 4 converts incoming DC power into AC power that complies with power grid connection specifications and integrating the converted AC power into a power grid G.

The power output controller 5 electrically coupled to the pair of DC bus wires 3 and electrically connected to the inverter 4 to integrate the DC power generated by all solar cell modules 1. Since the power generated by each solar cell module 1 will change with the position of the sun and the amount of light, if the power is too high, for example, after the current exceeds a set value, the power output controller 5 can break the electrical coupling with the pair of DC bus wires 3 (via fuse). In addition, the power output controller 5 may also convert part of the integrated DC power into DC power with a working voltage and then outputting the converted DC power and pass the remaining integrated DC power into the inverter 4. The remaining integrated DC power is integrated into the power grid G after conversion.

The circuit switch control circuit 6 is electrically connected to the power output controller 5 and signally connecting (indicated by dotted lines) to the circuit switches S and the temperature detectors T of the solar cell modules 1. It can continuously receive a temperature measurement value from any temperature detector T and perform following operations. A first operation: determining whether the temperature measurement value is lower than 0 degrees Celsius. Taking 0 degrees Celsius as the criterion requires heating to remove ice that may condense on the solar cell module 1. This is also the most important purpose of the temperature detector T. A second operation: if the judgment of the first operation being true, turning on the circuit switch S of the solar cell module 1 where the temperature detector T is located to conduct the circuit between the flexible lithium ceramic battery and the conductive heating film layer to heat the solar cell module 1. This operation can heat the solar cell module 1 whose temperature is below 0 degrees Celsius, with the purpose of raising the temperature of the solar cell module 1 to a point where water vapor cannot condense on it. A third operation: if the temperature measurement value transmitted by the temperature detector T of the solar cell module 1 after heating being higher than a set temperature, then turning off the circuit switch S of the solar cell module 1 to interrupt the circuit between the flexible lithium ceramic battery and the conductive heating film layer. This operation determines the conditions for stopping heating of solar cell module 1. Although heating the solar cell module 1 to a higher temperature can also increase the working efficiency of the solar cell module 1 while melting ice, an excessively high heating temperature means that too much generated power is consumed, and the purpose of the solar cell module 1 to generate electricity normally cannot be reached. Hence, the decision of the set temperature is very important. According to the present invention, the set temperature may be between 5 degrees Celsius and 25 degrees Celsius. Take 5 degrees Celsius as the set temperature for illustration. When a solar cell module 1 is detected at −2 degrees Celsius, it will be heated to 5 degrees Celsius to melt the ice on it. When heating is stopped, the solar cell module 1 gradually cools down to 0 degrees Celsius. At this point, the circuit switch S conducts the circuit between the flexible lithium ceramic battery and the conductive heating film layer again to heat the solar cell module 1 again. Repeating this process, the temperature of the solar cell module 1 is between 0 degrees Celsius and 5 degrees Celsius, but there is no ice attached to it.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A solar energy power system with ice-dissolving function, comprising:

a plurality of solar cell modules, wherein each solar cell module comprises:

a substrate, comprising a first area and a second area surrounding the first area, wherein a plurality of through holes are formed in the first area adjacent to the second area;

a flexible lithium ceramic battery (FLCB) fixed below the first area, having a positive contact and a negative contact;

a first bonding layer, laid and bonded over the first area;

a conductive heating film layer, located above the first bonding layer, bonded to the substrate through the first bonding layer;

a second bonding layer, laid and bonded over the conductive heating film layer;

a plurality of solar cells, fixed in the second bonding layer, wherein the plurality of solar cells are electrically connected in parallel and/or series, and electrical energy converted from solar energy is output through a positive wire and a negative wire, wherein the positive wire extends out of the second bonding layer and passes through one of the through holes to electrically connect with the positive contact and a positive end of a load, and the negative wire extends out of the second bonding layer and passes through another of the through holes to electrically connect with the negative contact and a negative end of the load;

a waterproof film layer, bonded on top of the second bonding layer preventing moisture from intruding into the structure therebelow;

a third bonding layer, laid and bonded over the waterproof film layer;

a highly transparent light-concentrating Ethylene Tetrafluoroethylene (ETFE) layer, with an upper surface thereof having a plurality of brightness enhancement structures having a three-dimensional corrugated shape with no sharp point, bonded on top of the third bonding layer, wherein multi-directional light beams from the outside are guided to inside of the brightness enhancement structures by the brightness enhancement structures and incident downward to the solar cells; and a ring bonding wall, surroundingly bonded to the sides of the first bonding layer, the conductive heating film layer, the second bonding layer, the waterproof film layer and the third bonding layer, wherein the positive contact and the negative contact are respectively connected to the conductive heating film layer through one of the through holes with a wire, a circuit switch is installed on one of the wires to conduct or break a circuit between the flexible lithium ceramic battery and the conductive heating film layer, and a portion of the positive wire, a portion of the negative wire are embedded in the ring bonding wall, and a temperature detector is further installed on the second area to detect the temperature at the substrate and transmit detection results to the outside through a signal line, or comprises:

a substrate, comprising a first area and a second area surrounding the first area;

a first bonding layer, laid and bonded over the first area;

a flexible lithium ceramic battery, fixed in the first bonding layer, having a positive contact and a negative contact;

a conductive heating film layer, located above the first bonding layer, bonded to the substrate through the first bonding layer;

a second bonding layer, laid and bonded over the conductive heating film layer;

a plurality of solar cells, fixed in the second bonding layer, wherein the plurality of solar cells are electrically connected in parallel and/or series, and electrical energy converted from solar energy is output through a positive wire and a negative wire, wherein the positive wire extends out of the second bonding layer to electrically connect with the positive contact and a positive end of a load, and the negative wire extends out of the second bonding layer to electrically connect with the negative contact and a negative end of the load;

a waterproof film layer, bonded on top of the second bonding layer, preventing moisture from intruding into the structure therebelow;

a third bonding layer, laid and bonded over the waterproof film layer;

a highly transparent light-concentrating ETFE layer, with an upper surface thereof having a plurality of brightness enhancement structures having a three-dimensional corrugated shape with no sharp point, bonded on top of the third bonding layer, wherein multi-directional light beams from the outside are guided to inside of the brightness enhancement structures by the brightness enhancement structures and incident downward to the solar cells; and a ring bonding wall, surroundingly bonded to the sides of the first bonding layer, the conductive heating film layer, the second bonding layer, the waterproof film layer and the third bonding layer, wherein the positive contact and the negative contact are respectively connected to the conductive heating film layer with a wire, and a circuit switch is installed on one of the wires to conduct or break a circuit between the flexible lithium ceramic battery and the conductive heating film layer, a portion of the positive wire and a portion of the negative wire are embedded in the ring bonding wall, and a temperature detector is further installed on the second area to detect the temperature at the substrate and transmit detection results to the outside through a signal line;

a pair of DC bus wires, wherein a positive DC bus wire is electrically connected to extended ends of the positive wires in the solar cell modules, a negative DC bus wire is electrically connected to extended ends of the negative wires in the solar cell modules;

an inverter converting incoming DC power into AC power that complies with power grid connection specifications and integrating the converted AC power into a power grid;

a power output controller, electrically coupled to the pair of DC bus wires and electrically connected to the inverter, integrating the DC power generated by all solar cell modules, breaking the electrical coupling with the pair of DC bus wires after a current exceeds a set value, converting part of the integrated DC power into DC power with a working voltage and then outputting the converted DC power to an external load, and passing the remaining integrated DC power into the inverter; and a circuit switch control circuit, electrically connected to the power output controller and signally connecting to the circuit switches and temperature detectors of the solar cell modules, continuously receiving a temperature measurement value from any temperature detector and performing following operations:

a) determining whether the temperature measurement value is lower than 0 degrees Celsius, b) if the judgment of operation a) being true, turning on the circuit switch of the solar cell module where the temperature detector is located to conduct the circuit between the flexible lithium ceramic battery and the conductive heating film layer to heat the solar cell module; and c) if the temperature measurement value transmitted by the temperature detector of the solar cell module after heating being higher than a set temperature, then turning off the circuit switch of the solar cell module to interrupt the circuit between the flexible lithium ceramic battery and the conductive heating film layer.

2. The solar energy power system with ice-dissolving function according to claim 1, wherein the set temperature is between 5 degrees Celsius and 25 degrees Celsius.

* * * * *